(12) United States Patent
Darbari et al.

(10) Patent No.: US 10,755,011 B2
(45) Date of Patent: Aug. 25, 2020

(54) DETECTING OUT-OF-BOUNDS VIOLATIONS IN A HARDWARE DESIGN USING FORMAL VERIFICATION

(71) Applicant: Imagination Technologies Limited, Kings Langley (GB)

(72) Inventors: Ashish Darbari, Abbots Langley (GB); Iain Singleton, Hemel Hempstead (GB)

(73) Assignee: Imagination Technologies Limited, Kings Langley (GB)

( * ) Notice: Subject to any disclaimer, the term of this patent is extended or adjusted under 35 U.S.C. 154(b) by 284 days.

(21) Appl. No.: 15/784,353

(22) Filed: Oct. 16, 2017

(65) Prior Publication Data

US 2018/0107765 A1    Apr. 19, 2018

(30) Foreign Application Priority Data

Oct. 14, 2016    (GB) .................................. 1617531.7

(51) Int. Cl.
*G06F 30/3323*    (2020.01)
*G06F 11/07*    (2006.01)
*G06F 11/34*    (2006.01)
*G06F 30/39*    (2020.01)

(52) U.S. Cl.
CPC ...... *G06F 30/3323* (2020.01); *G06F 11/0754* (2013.01); *G06F 11/3466* (2013.01); *G06F 30/39* (2020.01)

(58) Field of Classification Search
USPC ....................................................... 716/106
See application file for complete search history.

(56) References Cited

U.S. PATENT DOCUMENTS

| | | | |
|---|---|---|---|
| 2002/0051538 A1 | 5/2002 | Kaplan et al. | |
| 2005/0257016 A1* | 11/2005 | Boles | G06F 12/1491 711/163 |
| 2008/0177990 A1* | 7/2008 | Banerjee | G06F 9/30156 712/227 |

FOREIGN PATENT DOCUMENTS

| | | |
|---|---|---|
| EP | 1329787 A2 | 7/2003 |
| EP | 1912419 A1 | 4/2008 |
| EP | 2669807 A2 | 12/2013 |
| WO | 2005/116842 A2 | 12/2005 |
| WO | 2006/093618 A2 | 9/2006 |

* cited by examiner

*Primary Examiner* — Eric D Lee
(74) *Attorney, Agent, or Firm* — Potomac Law Group, PLLC; Vincent M DeLuca

(57) ABSTRACT

A hardware monitor arranged to detect out-of-bounds violations in a hardware design for an electronic device. The hardware monitors include monitor and detection logic configured to monitor the current operating state of an instantiation of the hardware design and detect when the instantiation of the hardware design implements a fetch of an instruction from memory; and assertion evaluation logic configured to evaluate one or more assertions that assert a formal property that compares the memory address of the fetched instruction to an allowable memory address range associated with the current operating state of the instantiation of the hardware design to determine whether there has been an out-of-bounds violation. The hardware monitor may be used by a formal verification tool to exhaustively verify that the hardware design does not cause an instruction to be fetched from an out-of-bounds address.

17 Claims, 8 Drawing Sheets

DETECTING OUT-OF-BOUNDS VIOLATIONS IN A HARDWARE DESIGN USING FORMAL VERIFICATION

BACKGROUND

An electronic device comprising a processor for processing computer executable instructions to control operation of the device can typically operate in one of one or more operating states. An operating state may be defined by the program or application that is being executed on the electronic device or any other parameter or feature of the electronic device. For example, a simple electronic device may operate in either a boot operating state where the electronic device is executing a boot process, or a normal operating state where the electronic device is executing an application or program.

Each operating state is typically associated with one or more blocks of memory which can be accessed while the electronic device is operating in that operating state. The memory block(s) associated with a particular operating state may be used to store executable instructions and/or data that allow the electronic device to operating in the particular state. For example, in the simple electronic device described above, the boot operating state may be associated with one or more blocks of BOOT read only memory (ROM) which are used to store executable instructions and/or data associated with the boot process; and the normal operating state may be associated with one or more blocks of random access memory (RAM) which are used to store executable instructions and/or data associated with the application or program.

If an electronic device is operating in a particular operating state and accesses memory that is not associated with the particular operating state then there has been an out-of-bounds memory access violation, which may be referred to herein as an out-of-bounds violation. For example, if the simple electronic device described above accesses the one or more blocks of RAM associated with the normal operating state during the boot process then there has been an out-of-bounds violation. Similarly, if the electronic device accesses the BOOT ROM after the boot process has completed then there has been an out-of-bounds violation.

An out-of-bounds violation may cause the electronic device to behave unpredictably since the accessed memory location does not contain known or expected data or content.

The embodiments described below are provided by way of example only and are not limiting of implementations which solve any or all of the disadvantages of known methods and systems for addressing out-of-bounds violations.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Described herein are hardware monitors arranged to detect out-of-bounds violations in a hardware design for an electronic device. The hardware monitors include monitor and detection logic configured to repeatedly monitor the current operating state of an instantiation of the hardware design and detect when the instantiation of the hardware design implements a fetch of an instruction from memory; and assertion evaluation logic configured to evaluate one or more assertions that assert a formal property that compares the memory address of the fetched instruction to an allowable memory address range associated with the current operating state of the instantiation of the hardware design to determine whether there has been an out-of-bounds violation. The hardware monitor may be used by a formal verification tool to exhaustively verify that the hardware design does not cause an instruction to be fetched from an out-of-bounds address.

A first aspect provides a hardware monitor arranged to detect out-of-bounds violations in a hardware design for an electronic device, the hardware monitor comprising: monitor and detection logic configured to repeatedly determine a current operating state of an instantiation of the hardware design and detect when the instantiation of the hardware design implements a fetch of an instruction from memory; and assertion evaluation logic configured to evaluate one or more assertions that assert a formal property that compares a memory address of the fetched instruction to an allowable memory address range or an unallowable memory address range associated with the current operating state of the instantiation of the hardware design to determine whether an out-of-bounds violation has occurred in the hardware design.

A second aspect provides a method of detecting out-of-bounds violations in a hardware design for an electronic device, the method comprising: receiving the hardware design and a hardware monitor according to the first aspect; formally verifying, using a formal verification tool, the one or more assertions are true for the hardware design; and outputting one or more signals indicating whether or not each of the one or more assertions was successfully verified to identify whether an out-of-bounds violation occurs in the hardware design.

A third aspect provides a system configured to detect out-of-bounds violations in a hardware design for an electronic device, the system comprising: a memory configured to store: the hardware design; a formal verification tool; and the hardware monitor of the first aspect; one or more processors configured to: formally verify, using the formal verification tool, that the one or more assertions are true for the hardware design; and output one or more signals indicating whether or not each of the one or more assertions was successfully verified to identify whether an out-of-violation occurs in the hardware design.

The electronic device may be embodied in hardware on an integrated circuit. There may be provided a method of manufacturing, at an integrated circuit manufacturing system, an electronic device. There may be provided an integrated circuit definition dataset that, when processed in an integrated circuit manufacturing system, configures the system to manufacture an electronic device. There may be provided a non-transitory computer readable storage medium having stored thereon a computer readable description of an integrated circuit that, when processed, causes a layout processing system to generate a circuit layout description used in an integrated circuit manufacturing system to manufacture an electronic device.

There may be provided an integrated circuit manufacturing system comprising: a non-transitory computer readable storage medium having stored thereon a computer readable integrated circuit description (e.g. hardware design) that describes the electronic device; a layout processing system configured to process the integrated circuit description so as to generate a circuit layout description of an integrated circuit embodying the electronic device; and an integrated circuit generation system configured to manufacture the electronic device according to the circuit layout description.

There may be provided computer program code for performing a method as described herein. There may be provided non-transitory computer readable storage medium having stored thereon computer readable instructions that, when executed at a computer system, cause the computer system to perform the method as described herein.

The above features may be combined as appropriate, as would be apparent to a skilled person, and may be combined with any of the aspects of the examples described herein.

BRIEF DESCRIPTION OF THE DRAWINGS

Examples will now be described in detail with reference to the accompanying drawings in which.

Figure 1:
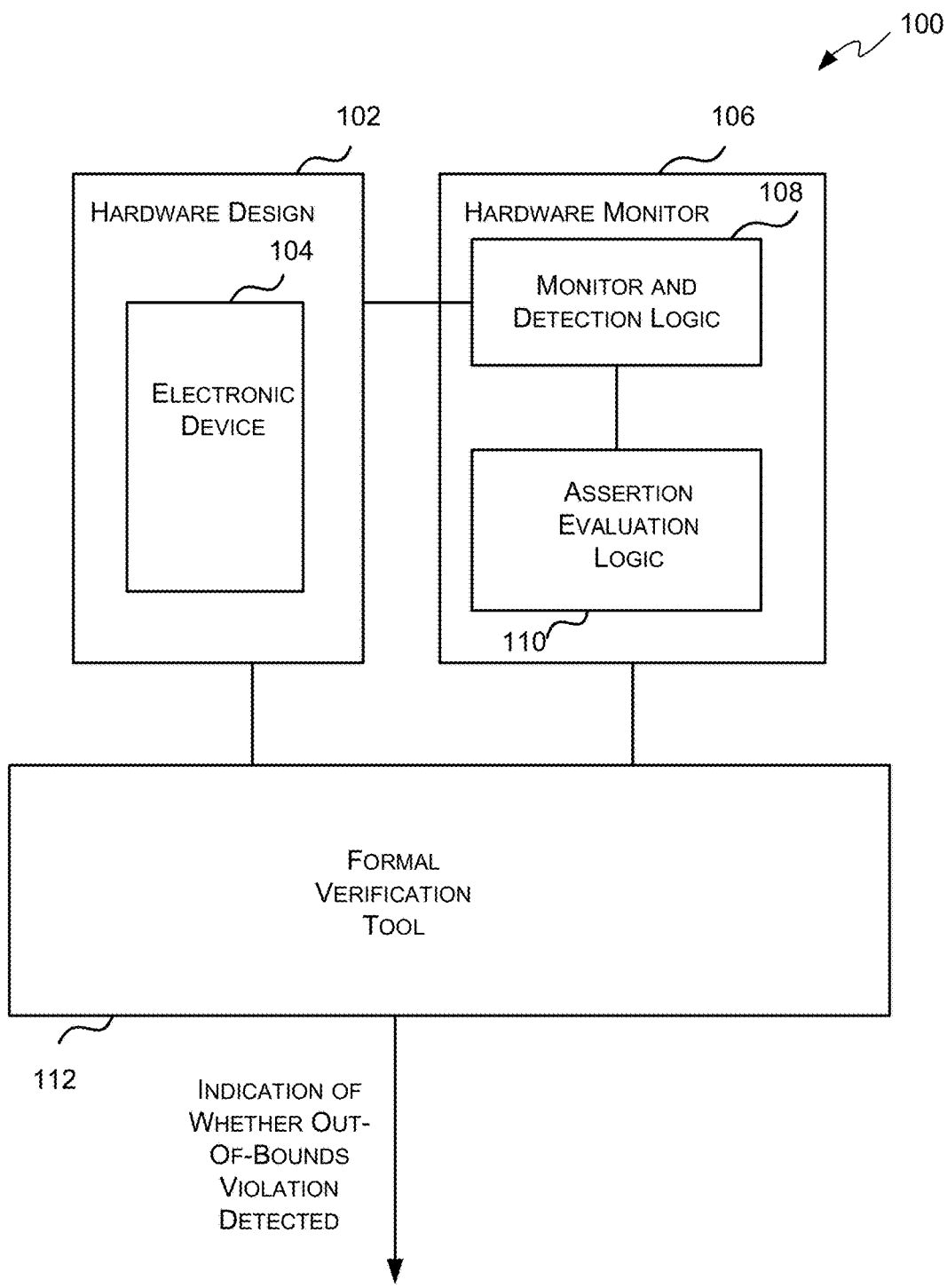
FIG. 1 is a block diagram of an example system for detecting out-of-bounds violations in a hardware design for an electronic device using formal.

The accompanying drawings illustrate various examples. The skilled person will appreciate that the illustrated element boundaries (e.g., boxes, groups of boxes, or other shapes) in the drawings represent one example of the boundaries. It may be that in some examples, one element may be designed as multiple elements or that multiple elements may be designed as one element. Common reference numerals are used throughout the figures to indicate similar features.

DETAILED DESCRIPTION

The following description is presented by way of example to enable a person skilled in the art to make and use the invention. The present invention is not limited to the embodiments described herein and various modifications to the disclosed embodiments will be apparent to those skilled in the art.

Embodiments will now be described by way of example only.

As described above, an electronic device comprising a processor for processing computer executable instructions to control operation of the electronic device can typically operate in one of one or more operating states. Each operating state is typically associated with one or more blocks of memory of the electronic device which can be accessed while the electronic device is operating in that operating state. If an electronic device is operating in a particular operating state and accesses memory that is not associated with the particular operating state then there has been an out-of-bounds memory access violation, or simply an out-of-bounds violation.

As described above, out-of-bounds violations can cause the electronic device to behave unpredictably. In addition, some out-of-bounds violations can also pose a security threat to the electronic device. For example, if a processor erroneously fetches (and executes) an instruction from an out-of-bounds memory address and this is discovered by a hacker the hacker could place malicious code at the out-of-bounds memory address to cause a rogue program to execute on the electronic device.

Such out-of-bounds violations may be caused by the software running on the device (e.g. an error or bug in the software, or, malicious code loaded onto the device by, for example, a hacker), or, by an error or bug in the hardware. For example, there may be an error or bug in the hardware that causes the hardware to incorrectly generate the address of the next instruction to be fetched from memory. There are various ways in which the address of the next instruction may be generated, which may include, but is not limited to, incrementing the current address by a fixed value, and/or performing a more complex operation such as computing a branch address via speculation. There may be an error or bug in the hardware that implements any of these methods of address generation. It will be evident to a person of skill in the art that this is an example only and that there may be errors in other hardware components that cause an out-of-bounds violation to occur.

Traditionally security has been considered a software problem. However a more secure electronic device, or at least an electronic device that is less prone to such a security violation, can be generated if bugs or errors in the hardware design (for the electronic device) that cause out-of-bounds violations can be detected and corrected before the hardware design is implemented in hardware. This is particularly true for out-of-bounds violations that relate to fetching instructions from memory for execution.

Accordingly, the embodiments described herein relate to methods, systems and hardware monitors for detecting out-of-bounds violations in a hardware design using formal. The methods include monitoring the current operating state of an instantiation of the hardware design; detecting when an instruction is fetched from memory by an instantiation of the hardware design; and in response to detecting an instruction has been fetched, evaluating one or more assertions that assert a formal property that compares the memory address of the fetched instruction to an allowable and/or unallowable memory address range associated with the current operating state of the instantiation of the hardware design to detect whether there has been an out-of-bounds violation. A formal verification tool can then be used to formally verify that the one or more assertions are true for all valid sequences of states of the hardware design to exhaustively verify that the hardware design does not have an error or bug that will cause an instruction to be fetched from an out-of-bounds address.

In formal verification, the hardware design is transformed into a mathematical model (e.g. a state-transition system) to thereby provide an instantiation of the hardware design which can be tested to verify the hardware design, and the properties to be verified are expressed using mathematical logic using a precise syntax or a language with a precise mathematical syntax and semantics. A property is then verified by searching the entire reachable state space of the hardware design without explicitly traversing the state machine. Since formal verification algorithmically and exhaustively explores all input values over time, verifying properties in this manner allows a property to be exhaustively proved or disproved for all valid states. In the embodiments described herein the formal verification of the assertion(s) allows exhaustive verification that the hardware design does not have an error or bug that will cause an instruction to be fetched from an out-of-bounds memory address.

Many verification engineers tend to discount using formal verification to verify there are no out-of-bounds violations in a hardware design for an electronic device on the belief that the formal verification tool will not be able to converge (resulting in an inconclusive answer) due to the large state-space explosion problem. However, using the methods, systems and hardware monitors described herein to verify that there is not an error or bug in the hardware design that will cause an instruction to be fetched from an out-of-bounds memory address allows all of the relevant stimulus, or inputs, to be exhaustively tested in a quick and efficient manner.

Reference is now made to FIG. 1 which illustrates an example system 100 for detecting out-of-bounds violations in a hardware design using formal. The system 100 comprises a hardware design 102 that describes an electronic device 104; a hardware monitor 106 comprising monitor and detection logic 108 configured to repeatedly monitor the current operating state of an instantiation of the hardware design 102 and detect when the instantiation of the hardware design 102 implements a fetch of an instruction from memory; and assertion evaluation logic 110 configured to evaluate one or more assertions that assert a formal property that compares the memory address of the fetched instruction to an allowable memory address range or an unallowable memory address range associated with the current operating state of the instantiation of the hardware design to detect whether there was an out-of-bounds violation. The system 100 also includes a formal verification tool 112 configured to use the hardware monitor 106 to exhaustively verify that the hardware design 102 does not have a bug or error that will cause it to fetch an instruction from an out-of-bounds address.

The term "hardware design" is used herein to refer to a description of the structure and function of an integrated circuit which when processed at an integrated circuit manufacturing system causes the integrated circuit manufacturing system to generate an integrated circuit described by the hardware design. For example, as described in more detail below with respect to FIG. 8, when a hardware design is processed at an integrated circuit manufacturing system the integrated circuit manufacturing system may generate the integrated circuit by synthesizing the hardware design into silicon, or, by loading configuration data into an a field-programmable gate array (FPGA).

The hardware design 102 may be implemented in a high level hardware description language (HDL), such as, but not limited to, a register transfer level (RTL) language. Examples of register transfer level languages include, but are not limited to, VHDL (VHSIC Hardware Description Language) and Verilog. It will be evident to a person of skill in the art that other high level hardware description languages may be used such as proprietary high level hardware description languages.

The term "instantiation of a hardware design" is used herein to refer to a representation of the hardware defined by the hardware design. An instantiation of a hardware design includes, but is not limited to, a synthesized version of the hardware design, a hardware implementation (e.g. integrated circuit) made to the hardware design, and a mathematical model (e.g. a state-transition system) generated by a formal verification tool. An instantiation of the hardware design embodies the hardware design in a form which can be tested to verify the hardware design.

The hardware design 102 of FIG. 1 describes the structure and functionality of an integrated circuit that forms an electronic device 104. An electronic device 104 is any kind of device, machine, or dedicated circuit, or collection or portion therefore comprising one or more processors that can execute computer-readable instructions stored in memory accessible to the electronic device 104.

A processor may be any kind of general purpose or dedicated processor, such as a CPU, GPU, System-on-chip, state machine, media processor, an application-specific integrated circuit (ASIC), a programmable logic array, a field-programmable gate array (FPGA), physics processing units (PPUs), radio processing units (RPUs), digital signal processors (DSPs), general purpose processors (e.g. a general purpose GPU), microprocessors, any processing unit which is designed to accelerate tasks outside of a CPU, etc. Those skilled in the art will realize that such processing capabilities are incorporated into many different devices and therefore the term 'computer' includes set top boxes, media players, digital radios, PCs, servers, mobile telephones, personal digital assistants and many other devices.

As is known to those of a skill in the art a processor fetches instructions from a program, decodes the fetched instructions, executes the decoded instructions, and stores/commits the results of the executed instructions in memory and/or registers. The processor may be any processor capable of executing instructions. For example, the processor may be a pipelined or un-pipelined processor, a single-threaded or multi-threaded processor, an in-order or out-of-order processor or any combination thereof.

The memory accessible to the electronic device 104 may be any technology suitable for storing computer readable instructions such as RAM, ROM, EPROM, EEPROM, flash memory, other memory technology, or any combination thereof. The memory may be part of the electronic device 104 or located remotely from the electronic device 104 and accessible by a network or other connection.

Figure 2:
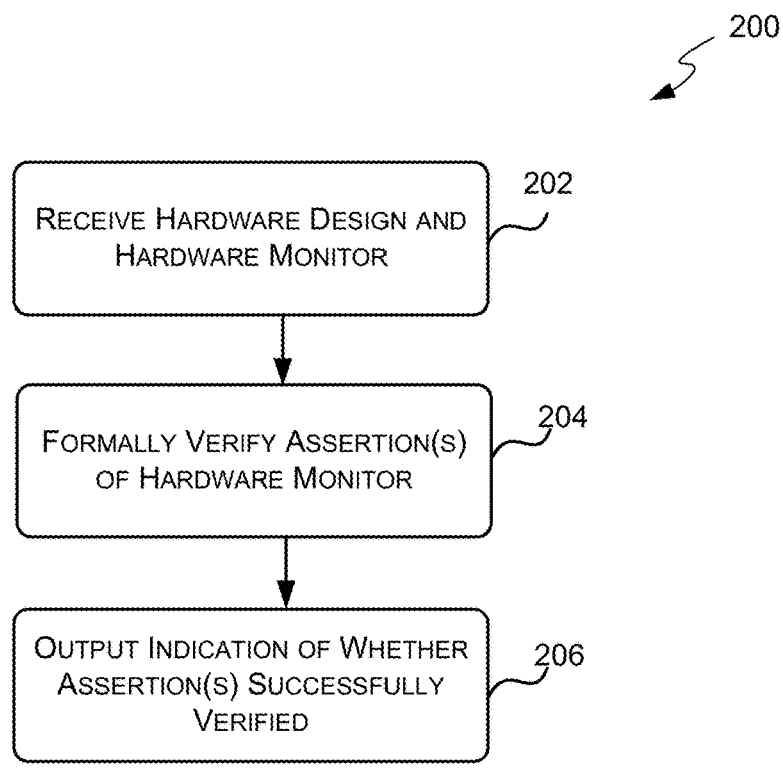
FIG. 2 is a flow diagram of an example method for detecting out-of-bounds violations in a hardware design for an electronic device using the system of FIG. 1.

The hardware design 102 of FIG. 2 is configured so that an instantiation of the hardware design 102 can operate in one of one or more operating states. Each operating state may be defined by the program or application that is being executed by the instantiation of the hardware design 102 or any other parameter or feature of the hardware design 102. For example, a hardware design 102 for a simple electronic device, such as a power management unit (PMU) may be configured so that an instantiation of the hardware design can operate in one of two operating states: a boot operating state where, for example, the instantiation of the hardware design 102 is implementing a boot process; and a normal operating state where the instantiation of the hardware design 102 is executing one or more programs or applications. The hardware design 102 may be configured so that the instantiation of the hardware design 102 initially operates in the boot operating state, and transitions to the normal operating state after the boot process is complete. It will be evident to a person of skill in the art that this is an example only and the methods, systems and techniques described herein are applicable to hardware designs 102 that define one or more than one operating state.

Each operating state is associated with one more blocks of memory that the instantiation of the hardware design 102 is permitted to access while operating in that operating state. Such blocks of memory are referred to herein as allowable memory blocks for the particular operating state. The memory blocks that are not part of the allowable memory blocks for a particular operating state are referred to herein as the unallowable memory blocks for the particular operating state. Each block of memory is defined and accessible by a memory address range. The address range defining an allowable memory block will be referred to herein as an allowable memory address range and the address range defining an unallowable memory block will be referred to herein as an unallowable memory address range.

The allowable blocks of memory may be used to store executable instructions and/or data that allow an instantiation of the hardware design 102 to operate in that particular operating state. For example, the boot operating state may be associated with a special type of read only memory (ROM) defined in the hardware design 102 referred to as BOOT ROM, whereas the normal operating state may be associated with another type of memory defined in the hardware design 102 such as random access memory (RAM).

It is expected that while an instantiation of the hardware design 102 is operating in a particular state that the instantiation of the hardware design 102 will only access the allowable memory blocks for that operating state. However, as described above, there may be an error or bug in hardware design 102 that causes the instantiation of the hardware design 102 to access an unallowable memory block which is referred to herein as an out-of-bounds violation. One of the most significant out-of-bounds violations is loading an instruction from an unallowable memory block as it may allow a rogue program to execute on an electronic device generated from the hardware design 102.

The hardware monitor 106 is a module configured to determine the current operating state of an instantiation of the hardware design 102 repeatedly at a number of instances in time (which may be regular/irregular or may be triggered by an external event) and detect when the instantiation of the hardware design 102 implements a fetch of an instruction from memory; and, evaluate one or more assertions that assert a formal property that compares the memory address of the fetched instruction to an allowable and/or unallowable memory address range associated with the current operating state of the instantiation of the hardware design to detect whether there has been an out-of-bounds violation.

In the example of FIG. 1, the hardware monitor 106 comprises monitor and detection logic 108 and assertion evaluation logic 110. The monitor and detection logic 108 is configured to monitor one or more control signals and/or data signals of the hardware design 102 to (i) determine and monitor the current state of an instantiation of the hardware design; and (ii) detect when the instantiation of the hardware design 102 has fetched an instruction from memory. The specific control signals and/or data signals that are monitored and the configuration thereof that (i) indicate the instantiation of the hardware design 102 is in a particular operating state; and/or (ii) indicate that the instantiation of the hardware design 102 has fetched an instruction from memory, depends on the configuration of the hardware design 102. Example implementations of the monitor and detection logic 108 will be described with reference to FIGS. 3 and 5.

The assertion evaluation logic 110 is configured to evaluate one or more assertions that assert a formal property that compares the memory address of the fetched instruction to an allowable and/or unallowable memory address range associated with the current operating state of the instantiation of the hardware design 102 to detect whether there has been an out-of-bounds violation.

As is known to those of skill in the art, a formal property is a statement or expression that captures design behavior. For example, a simple formal property may be a=b. Within HDL designs, a formal property is an executable statement that checks for specific behavior within the HDL design. For example, if a design contains a FIFO (first in first out) buffer a formal property may state that neither overflow nor underflow of the FIFO may occur.

Formal properties are used to capture required or desired temporal behavior of the hardware design in a formal and unambiguous way. The hardware design can then be verified to determine that it conforms to the required or desired behavior as captured by one or more properties.

Formal properties are typically written in an assertion language. An assertion language, which also may be referred to as a property language, captures the design behavior over multiple design cycles in a concise, unambiguous manner. While traditional hardware description languages (HDL), such as VHDL or Verilog RTL, have the ability to capture individual cycle behavior, they are too detailed to describe properties at a higher level. In particular, assertion languages provide means to express temporal relationships and complex design behaviors in a concise manner. Assertion languages include, but are not limited to, SystemVerilog Assertions (SVA), Property Specification Language (PSL), Incisive® Assertion Library (IAL), Synopsys® OpenVera™ Assertions (OVA), Symbolic Trajectory Evaluation (STE), Hardware Property Language (HPL), 0-In®, and Open Verification Library (OVL).

A formal property may be asserted or covered. When a formal property is asserted it must always be true. In contrast, when a property is covered the property must be true at least once, but is not required to be true always. An asserted property is said to form an assertion. An example assertion of the property a=b is assert property (a=b). Similarly a covered property is said to form a cover. An example cover of the property a=b is cover property (a=b).

Formal properties are typically 'clocked', meaning that that they are only evaluated upon a clock event occurring (e.g. upon the positive edge of a clock signal or the negative edge of a clock signal). Accordingly, assertions or covers generally indicate which clock and which clock edge triggers evaluation of the formal property. An example SVA assertion of the formal property a=b is as follows:

assert (@(posedge clk) property (a==b));

It will be evident to a person of skill in the art that in the example SVA assertion above, the formal property a==b will be evaluated on the positive edge (posedge) of the clock signal (clk).

In the system of FIG. 1 the assertion evaluation logic 110 is configured to evaluate at least one assertion that asserts a formal property that compares the memory address of the fetched instruction to an allowable and/or unallowable memory address range associated with the current operating state of the instantiation of the hardware design to detect whether there has been an out-of-bounds violation.

As described above, at any point in time an instantiation of the hardware design 102 will be in one of one or more operating states. Each operating state is associated with one or more allowable blocks of memory which the instantiation of the hardware design 102 is permitted to access while operating in that particular operating state. Memory blocks that are not allowable memory blocks for a particular operating state are unallowable memory blocks. Each allowable block of memory is defined by an allowable memory address range and each unallowable block of memory is defined by an unallowable memory address range. If an instantiation of the hardware design 102 accesses a memory address in an unallowable memory address range for a particular operating state while operating in that particular operating state then there has been an out-of-bounds violation and thus there is an error or bug in the hardware design 102.

The relationship between the operating states and the allowable memory block(s) and/or unallowable memory block(s) may be set out in the specification for the hardware design 102.

The assertion evaluation logic 110 may be configured to, for example, evaluate one or more assertions, for each operating state that assert that if an instantiation of the hardware design 102 is operating in a particular operating state when an instruction is fetched from memory that the memory address of the fetched instruction falls within an allowable memory range. For example, if the hardware design 102 defines a first operating state that has an allowable address range from address A to address B, and a second operating state that has an allowable address range from address C to address D then the assertion evaluation logic 110 may evaluate a first assertion that states if an instantiation of the hardware design 102 is in the first operating state then the memory address of any fetched instruction is between address A to address B; and a second assertion that states that if the instantiation of the hardware design 102 is in the second operating state then the memory address of any fetched instruction is between address C and D.

Alternatively, or in addition, the assertion evaluation logic 110 may evaluate one or more assertions, for each operating state that asserts that if an instantiation of the hardware design 102 is operating in that particular operating state when an instruction is fetched from memory that the memory address of the fetched instruction does not fall within an unallowable memory address range. For example, for a hardware design 102 defining the first and second operating states and associated memory address ranges described above the assertion evaluation logic 110 may evaluate a first assertion that states if an instantiation of the hardware design 102 is in the first operating state then the memory address of the fetched instruction is not between address C and address D; and a second assertion that states that if the instantiation of the hardware design 102 is in the second operating state then the memory address of the fetched instruction is not between address A and B.

It will be evident to a person of skill in the art that these are examples only and other assertions that compare the memory address of a fetched instruction to an allowable and/or an unallowable memory address range may be used to detect an out-of-bounds violation in the hardware design 102.

The hardware monitor 106 may be implemented in software. For example, the hardware monitor 106 may be implemented using a hardware description language (HDL), an assertion language (e.g. System Verilog Assertions (SVA)), or a combination thereof.

The hardware monitor 106 is bound to the hardware design 102 to monitor the operating state of an instantiation of the hardware design 102, and detect instruction fetches by the instantiation of the hardware design 102 to detect an out-of-bounds violation. Where the hardware monitor 106 is implemented in SVA and the hardware design 102 is implemented in RTL, the SVA code is bound to the RTL code.

The hardware design 102 (e.g. RTL), hardware monitor 106 (e.g. SVA), and bindings, are loaded into a formal verification tool 112. The formal verification tool 112 is a software tool that is capable of performing formal verification of a hardware design. Examples of formal verification tools include, but are not limited to, OneSpin 360 DV™, Mentor Graphics Questa® Formal Verification, Synopsys VC Formal, Cadence® Incisive® Enterprise Verifier, and JasperGold®.

Formal verification is a systematic process that uses mathematical reasoning to verify a property in a hardware design. Formal verification can be contrasted to simulation-based verification in which a hardware design is tested by applying stimuli to an instantiation of the hardware design and monitoring the output of the instantiation of the hardware design in response to the stimuli.

In formal verification the hardware design (e.g. hardware design 102) is transformed into a mathematical model (e.g. a state-transition system) to thereby provide an instantiation of the hardware design which can be tested to verify the hardware design, and the formal properties (e.g. those evaluated by the assertion evaluation logic 110) are expressed using mathematical logic using a precise syntax or a language with a precise mathematical syntax and semantics.

A formal property is verified by searching the entire reachable state space of the instantiation of the hardware design (e.g. state transition system) without explicitly traversing the state machine. The search is done by, for example, encoding the states using efficient Boolean encodings using Binary decision diagrams (BDDS), or using advanced SAT (satisfiability-based bounded model checking) based techniques. In some cases tools can be used to implement techniques, such as, but not limited to, abstraction, symmetry, symbolic indexing, and invariants to improve performance and achieve scalability.

A formal property that is covered is verified by searching the reachable state space of the instantiation of the hardware design (e.g. state transition system) for at least one valid state in which the property is true. Once a valid state is found in which the property is true then the searching ceases. In contrast, a formal property that is asserted is verified by confirming the property is true for all valid states (as defined by formal constraints). In other words, an asserted property is verified by searching the reachable state space of the instantiation of the hardware design for a valid state in which the property is not true. Since formal verification of an asserted property algorithmically and exhaustively explores all valid input values over time, verifying an asserted property in this manner allows a property to be exhaustively proved or disproved for all valid states.

When the formal verification tool 112 is used to verify an assertion, the formal verification tool 112 may output an indication of whether or not the assertion is valid (i.e. is true for all valid states or sequence of states), which may also be referred to herein as the assertion being successfully verified. The output may be yes the assertion is valid or has been successfully verified; no the assertion is not valid (i.e. it is not true or has failed for at least one valid state or sequence of states) or has not been successfully verified; or the formal verification was inconclusive. The formal verification may be inconclusive, for example, because the general purpose computing-based device running the formal verification tool 112 has run out of memory or because the formal verification tool 112 has determined that a certain amount of progress has not been made after a predefined period of time.

Where an assertion is not valid or has not been successfully verified, the formal verification tool 112 may also output information indicating a state or sequence of states of the hardware design 102 which causes the assertion to fail. For example, the formal verification tool 112 may output a trace of the verification indicating at what point, state or sequence of states the failure occurred.

Reference is now made to FIG. 2 which illustrates a flow diagram of an example method 200 for exhaustively verifying that a hardware design 102 does not comprise a bug or error that will cause an out-of-bounds violation to occur. The method 200 may be implemented on a general purpose computing-based device, such as the general purpose computing-based device 700 described below with reference to FIG. 7.

The method 200 begins at block 202 where the hardware design 102 and the hardware monitor 106 are received at the general purpose computing-based device 700. As described above, the hardware design 102 defines the structure and functionality of an integrated circuit to implement an electronic device 104; and the hardware monitor 106 is configured to repeatedly monitor the current operating state of an instantiation of the hardware design 102 and detect when the instantiation of the hardware design implements a fetch of an instruction from memory; and, evaluate one or more assertions that assert a formal property that compares the memory address of the fetched instruction to an allowable and/or unallowable memory address range associated with the current operating state of the instantiation of the hardware design to detect whether there has been an out-of-bounds violation.

Once the hardware design 102 and the hardware monitor 106 have been received the method 200 proceeds to block 204.

At block 204, the formal verification tool 112, formally verifies the assertion(s) defined in the hardware monitor 106 for the hardware design 102. Formally verifying an assertion comprises verifying that for all valid sequences of states of the instantiation of the hardware design 102 (as defined by formal constraints) that the property is true. For example, verifying an assertion that if the instantiation of the hardware design 102 is in a particular operating state when an instruction is fetched from memory that the memory address is within a particular address range comprises determining whether there is a valid sequence of states for the instantiation of the hardware design 102 in which the address of the fetched instruction does not fall within the specified address range.

Once the formal verification ends the method 200 proceeds to block 206.

At block 206, the formal verification tool 112 outputs one or more signals indicating whether the assertion(s) were successfully verified or not. The one or more signals identify whether the hardware design 102 has a bug or error that causes an out-of-bounds violation. Specifically, if the assertion(s) have been formally verified (i.e. the assertions are true for all valid sequences of states of the hardware design 102) then it has been exhaustively verified that the hardware design 102 does not have an error or bug that will cause an out-of-bounds violation. If, however, the assertions were not formally verified (i.e. there is at least one sequence of states in which an assertion is not true) then the hardware design 102 has a bug or error that will cause an out-of-bounds violation.

Where an asserted property has not been successfully verified the formal verification tool 112 may also output an indication of a sequence of states of the instantiation of the hardware design 102 in which the assertion is not true. The indication of the sequence of states of the instantiation of the hardware design 102 in which the assertion is not true may be used by an engineer or designer to modify the hardware design 102 to correct the error or bug causing the out-of-bounds violation.

In particular, once the verification is complete the hardware design 102 may be modified based on the outcome of the verification (e.g. the information output by the formal verification tool 112). For example, if the verification indicates the hardware design 102 has an error or bug that causes an out-of-bounds violation then the hardware design 102 may be modified to correct its operation. The modified hardware design may then be re-verified, using for example the method of FIG. 2, and once verified that the hardware design does not have a bug that will cause an out-of-bounds violation the modified hardware design may be implemented in hardware to generate an integrated circuit as described with reference to FIG. 8.

Figure 3:
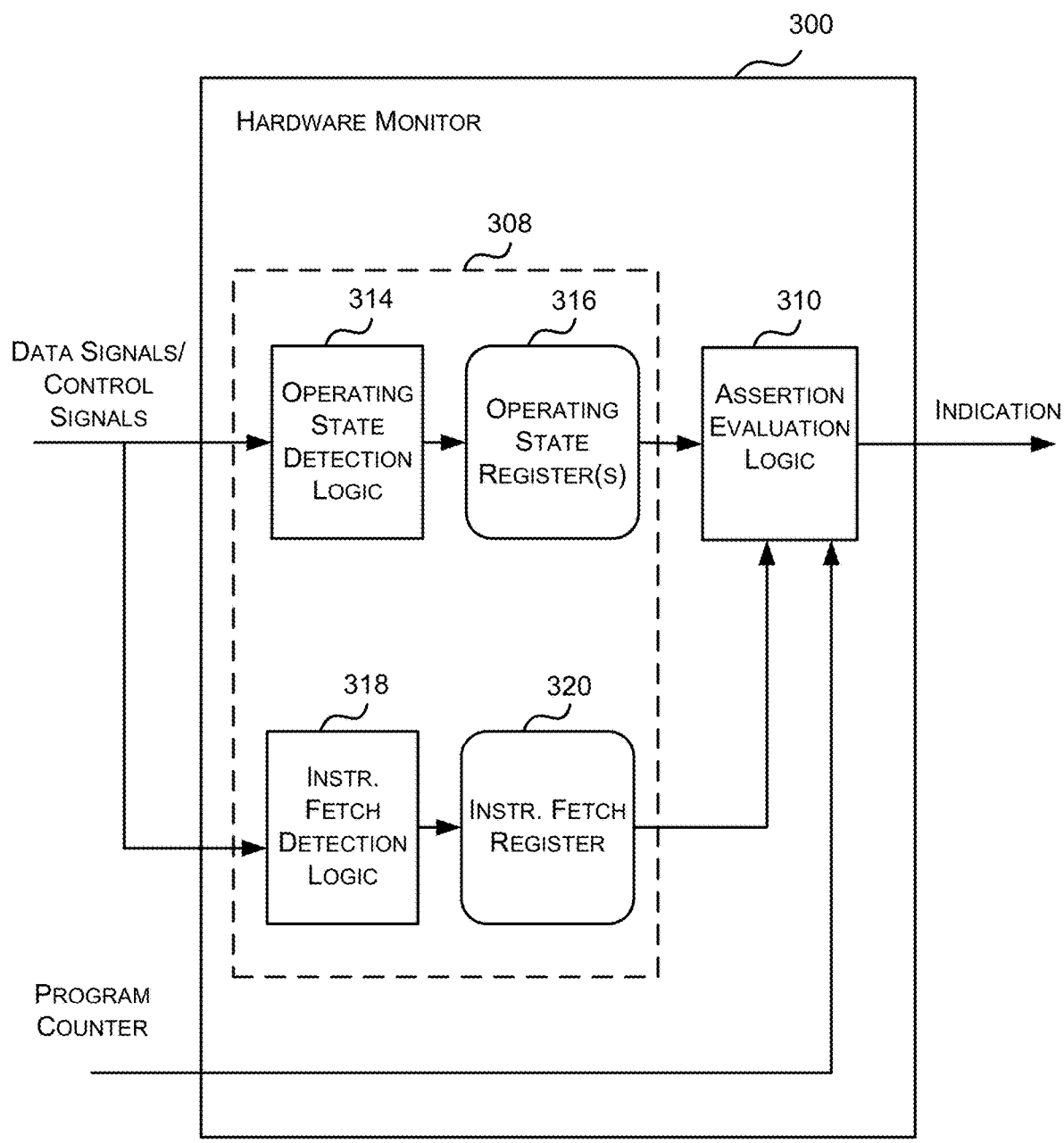
FIG. 3 is a block diagram of a first example implementation of the hardware monitor of FIG. 1 for detecting out-of-bounds violations in a hardware design for an electronic device.

Reference is now made to FIG. 3 which illustrates a first example implementation of a hardware monitor 300, which may be used as hardware monitor 106 of FIG. 1, for detecting out-of-bounds violations in a hardware design 102 for an electronic device 104. The hardware monitor 300 of FIG. 3 detects out-of-bounds violations in a hardware design 102 by detecting whether an instantiation of the hardware design 102 fetches an instruction from a memory address outside of an allowable memory address range for the operating state the instantiation of the hardware design 102 is in when it fetches the instruction.

The hardware monitor 300 comprises monitor and detection logic 308 for (i) detecting and monitoring the operating state of an instantiation of the hardware design 102, and (ii) detecting when the instantiation of the hardware design 102 implements a fetch of an instruction from memory; and assertion evaluation logic 310 configured to evaluate at least one assertion that asserts a formal property that compares the memory address of the fetched instruction to an allowable and/or unallowable memory address range associated with the current operating state of the instantiation of the hardware design to detect whether there has been an out-of-bounds violation.

The monitor and detection logic 308 comprises operating state detection logic 314 for detecting the operating state of an instantiation of the hardware design 102 and one or more operating state registers 316 for storing the results of the detection; and instruction fetch detection logic 318 for detecting when the instantiation of the hardware design 102 fetches an instruction from memory, and an instruction fetch register 320 for storing the results of the detection.

The operating state detection logic 314 is configured to monitor one or more control signals and/or data signals of the hardware design 102 to detect the current operating state of an instantiation of the hardware design 102. The specific control signals and/or data signals that are monitored, and the status thereof indicating a particular operating state will vary depending on the configuration of the hardware design 102.

The operating state detection logic 314 may set one or more operating state registers 316 to indicate the detected operating state of the instantiation of the hardware design 102. In some cases, there may be one operating state register for each possible operating state. In these cases, the operating state detection logic 314 may be configured to set the operating state register associated with the operating state the instantiation of the hardware design 102 is currently operating in and clear the other operating state registers 316. In other cases, where, for example, there are only two possible operating states, there may be a single operating state register 316 which indicates which of the two operating states the instantiation of the hardware design 102 is currently operating in based on whether it is set or not. For example, the operating state detection logic 314 may be configured to set the operating state register 316 when it detects that the instantiation of the hardware design 102 is operating in one of the states, and clear the operating state register 316 when it detects that the instantiation of the hardware design 102 is operating in the other operating state.

The instruction fetch detection logic 318 is configured to monitor one or more control signals and/or data signals of the hardware design 102 to detect when an instantiation of the hardware design 102 has fetched an instruction from memory. The specific control signals and/or data signals that are monitored, and the status thereof indicating an instruction has been fetched will vary depending on the configuration of the hardware design 102.

If the instruction fetch detection logic 318 detects that the instantiation of the hardware design 102 has fetched an instruction from memory the instruction fetch detection logic 318 may set the instruction fetch register 320 to indicate that an instruction fetch has been detected. Otherwise the instruction fetch detection logic 318 may clear the instruction fetch register 320.

The assertion evaluation logic 310 evaluates one or more assertions that assert a property that compares the memory address of the fetched instruction (e.g. the address of the program counter) to an allowable and/or unallowable memory address range associated with the current operating state of the instantiation of the hardware design to detect whether there has been an out-of-bounds violation.

The following is example SVA code for implementing such an assertion where operating_state_register is the operating state register 316 which is set when the operating state detection logic 314 detects the instantiation of the hardware design 102 is operating in a particular state, instruction_fetch_register is the instruction fetch register 320 which is set when the instruction fetch detection logic 318 detects that an instruction has been fetched from memory by the instantiation of the hardware design 102, program_counter is the program counter of the hardware design 102 which indicates the address from which the instruction was fetched, and bottom_address and top_address define an allowable address range for the particular operating state.

```
`define clk_rst @(posedge clk) disable iff (!resetn)
assert property (`clk_rst operating_state_register
  && instruction_fetch_register
  |-> ((program_counter > bottom_address) &&
       (program_counter < top_address))
```

It will be evident to a person of skill in the art that the above SVA code states that if the instantiation of the hardware design is operating in the predetermined operating state (operating_state_register) when the instantiation of the hardware design fetches an instruction from memory (instruction_fetch_register) then in the current clock cycle (|->) the address from which the instruction was fetched (program_counter) is in the allowable range (i.e. between the bottom_address and the top_address).

As described above, when a formal verification tool 112 formally verifies such an assertion it verifies that there is not a series of states of the instantiation of the hardware design 102 in which the assertion is not true. In other words, the formal verification tool 112 verifies that there is not a valid sequence of states of the instantiation of the hardware design 102 in which an instantiation of the hardware design 102 will be operating in the particular state and fetch an instruction from a memory address outside of the allowable memory address range for that particular operating state. If there is at least one valid sequence of states in which the assertion is not true then the assertion will fail and the formal verification tool 112 outputs an indication that the assertion is not true (and, possibly, an indication of the sequence of states that caused the assertion to fail).

Although, not shown in FIG. 3, it will be evident to a person of skill in the art that the logic blocks (e.g. operating state detection logic 314, instruction fetch detection logic 318 and assertion evaluation logic 310) may be triggered by a clock. For example, one or more of the logic blocks may be triggered by the rising or positive edge of the clock. Furthermore, it will be evident to a person of skill in the art that one or more of the logic blocks (e.g. operating state detection logic 314, instruction fetch detection logic 318, and assertion evaluation logic 310) may be combined or their functionality may divided between logic blocks in another manner.

Figure 4:
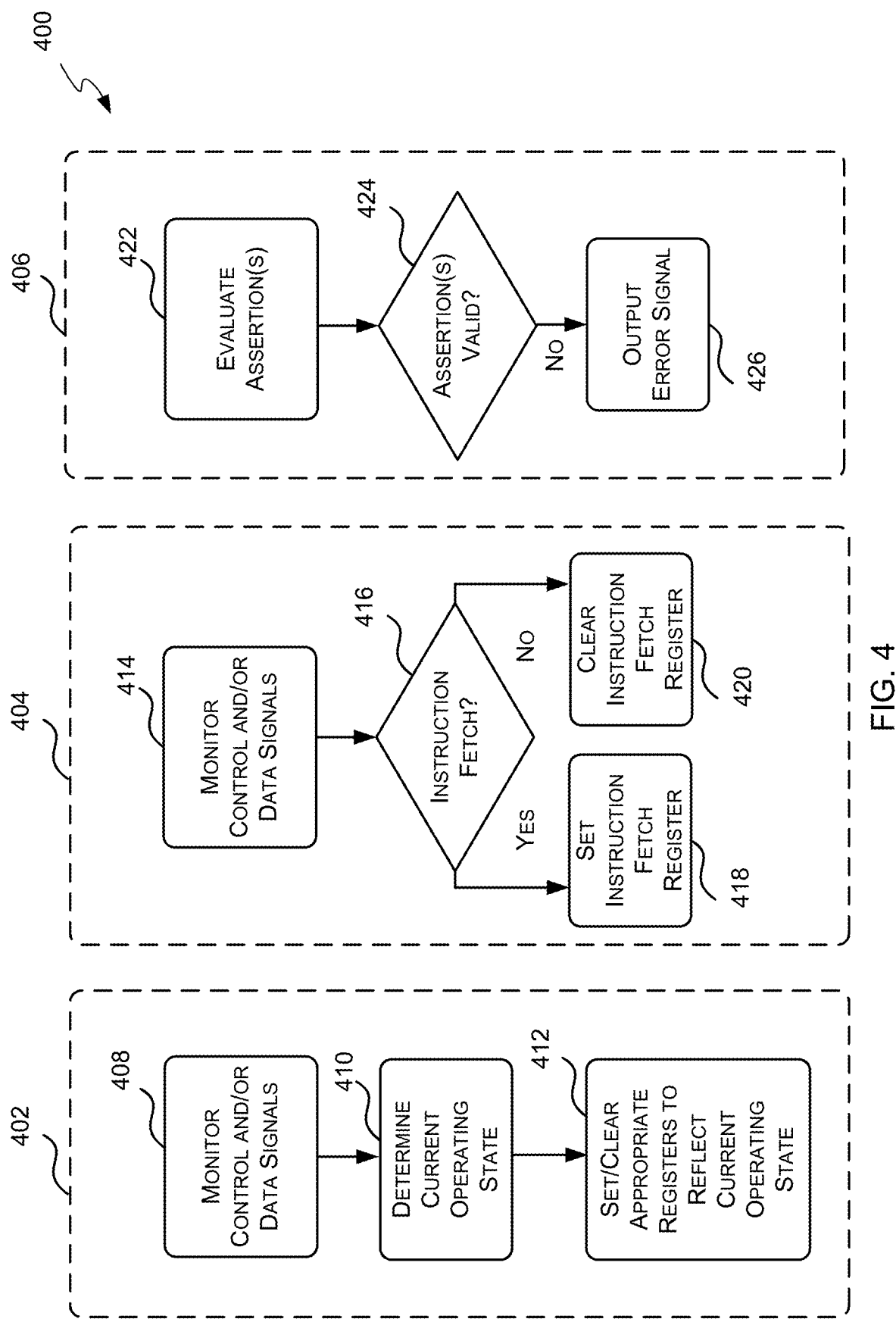
FIG. 4 is a flow diagram of an example method for detecting out-of-bounds violations in a hardware design for an electronic device using the hardware monitor of FIG. 3.

Reference is now made to FIG. 4 which illustrates an example method 400 for detecting out-of-bounds violations in a hardware design 102 which may be implemented by the hardware monitor 300 of FIG. 3. The method 400 detects an out-of-bounds violation by determining the current operating state of an instantiation of the hardware design 102 and detecting an out-of-bounds violation if the instantiation of the hardware design 102 fetches an instruction from a memory address outside of one or more allowable address ranges associated with the current operating state of the instantiation of the hardware design 102. The method 400 is divided into three sub-processes 402, 404 and 406 that are executed concurrently.

In the first sub-process 402, the operating state detection logic 314 is triggered each clock cycle to monitor one or more control signals and/or data signals of the hardware design 102 (block 408), determine the current operating state of an instantiation of the hardware design 102 based on the status of the monitored control and/or data signals (block 410), and set and/or clear the appropriate operating state register(s) 316 to reflect the current operating state of the instantiation of the hardware design 102 (block 412). The specific control signals and/or data signals and the status thereof that indicate an instantiation of the hardware design 102 is in a particular operating state depends on the configuration of the hardware design 102.

In the second sub-process 404, the instruction fetch detection logic 318 is triggered each clock cycle to monitor one or more control signals and/or data signals of the hardware design 102 (block 414), determine, based on the control and/or data signals, whether the instantiation of the hardware design 102 fetched an instruction from memory (block 416), and if so, setting the instruction fetch register 320 (block 418), and if not, clearing the instruction fetch register 320 (block 420). The specific control signals and/or data signals and the status thereof that indicate an instantiation of the hardware design 102 has fetched an instruction from memory depends on the configuration of the hardware design 102.

In the third sub-process 406, the assertion evaluation logic 310 is triggered each clock cycle to evaluate the one or more assertions that compare the address from which an instruction was fetched (indicated by the value of the program counter) to one or more allowable address ranges associated with the current operating state of an instantiation of the hardware design as indicated by the current operating state register(s) (block 422), and determine if all of the assertions hold, or are true (block 424). If one or more assertions are not true, indicating that there has been an out-of-bounds violation, then an error message or signal is output (block 426).

In the method 400 of FIG. 4 processes 402, 404 and 406 are triggered each clock cycle. In some cases the processes 402, 404 and 406 may be triggered by the rising or positive edge of a clock or the falling or negative edge of a clock. In other examples the processes 402, 404 and 406 may be triggered by another event.

Figure 5:
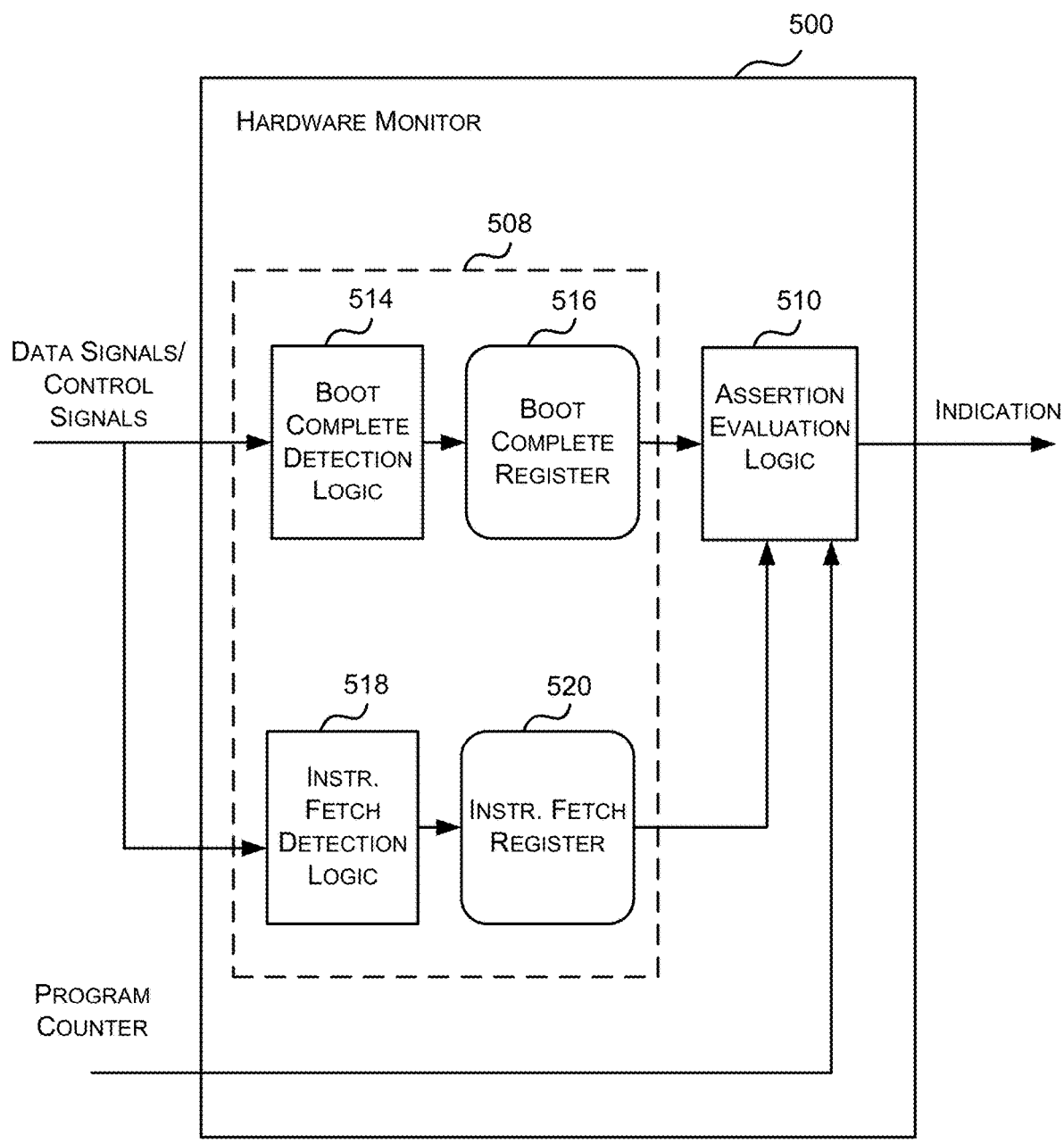
FIG. 5 is a block diagram of a second example implementation of the hardware monitor of FIG. 1 for detecting out-of-bounds violations in a hardware design for an electronic device.

Reference is now made to FIG. 5 which illustrates a second example implementation of a hardware monitor 500, which may be used as hardware monitor 106 of FIG. 1, for detecting out-of-bounds violations in a hardware design 102. The hardware monitor 500 of FIG. 5 detects out-of-bounds violations in hardware design 102 for an electronic device 104 that can operate in one of two operating states—a boot operating state where the electronic device executes a boot process using BOOT ROM, and a normal operating state where the electronic device executes an application using RAM—by detecting which of the two states an instantiation of the hardware design is operating in and determining that an out-of-bounds violation has occurred if the instantiation of the hardware design fetches an instruction from BOOT ROM when it is operating in the normal operating state or if the instantiation of the hardware design fetches an instruction from RAM when operating in the boot operating state.

The hardware monitor 500 comprises monitor and detection logic 508 for monitoring the current operating state of an instantiation of the hardware design 102 and detecting when the instantiation of the hardware design has 102 fetched an instruction from memory; and assertion evaluation logic 510 for evaluating one or more assertions that assert a property that compares the memory address of the fetched instruction (e.g. the address of the program counter) to an allowable and/or unallowable memory address range associated with the current operating state of the instantiation of the hardware design to detect whether there has been an out-of-bounds violation.

The hardware monitor 500 comprises monitor and detection logic 508 for (i) detecting whether the boot process of the instantiation of the hardware design 102 is complete (if it not complete then the instantiation of the hardware design 102 is operating in the boot operating state, and if it is complete then the instantiation of the hardware design 102 is operating in the normal operating state), and (ii) detecting when an instruction has been fetched from memory by the instantiation of the hardware design 102; and assertion evaluation logic 510 configured to evaluate at least one assertion that asserts a formal property that compares the memory address of the fetched instruction to either an address range defining the ROM or RAM based on whether the instantiation of the hardware design 102 was operating in the boot operating state or the normal operating state to detect whether there has been an out-of-bounds violation.

The monitor and detection logic 508 comprises boot complete detection logic 514 for detecting when the boot process is complete, and a boot complete register 516 for indicating that the boot complete detection logic 514 has detected that the boot process is complete; and instruction fetch detection logic 518 for detecting when the instantiation of the hardware monitor 102 fetches an instruction from memory, and an instruction fetch register 520 for indicating whether an instruction fetch has been detected.

The boot complete detection logic 514 is configured to monitor one or more control signals and/or data signals of the hardware design 102 to detect when the boot process is complete. This indicates the current operating state of the instantiation of the hardware design 102. In particular, in this example, if the boot process has not been completed then the instantiation of the hardware design 102 is operating in the boot operating state, whereas if the boot process has been completed then an instantiation of the hardware design 102 is operating in the normal operating state. The specific control signals and/or data signals that are monitored, and the status thereof indicating the boot process is complete will vary depending on the configuration of the hardware design 102. For example, some hardware designs 102 may define a signal called power_on_complete which, when the signal goes high, indicates that an instantiation of the hardware design has completed the boot process and is ready to execute user code.

The instruction fetch detection logic 518 is configured to monitor one or more control signals and/or data signals of the hardware design 102 to detect when an instantiation of the hardware design 102 has fetched an instruction from memory. The specific control signals and/or data signals that are monitored, and the status thereof indicating an instruction has been fetched from memory depends on the configuration of the hardware design 102. In some cases the instruction fetch detection logic 518 may be configured to monitor a program counter valid signal which indicates that the program counter has a valid address.

If the instruction fetch detection logic 518 detects that an instantiation of the hardware design 102 has fetched an instruction from memory the instruction fetch detection logic 518 may set the instruction fetch register 520 to indicate that an instruction fetch has been detected. Otherwise the instruction fetch detection logic 518 may clear the instruction fetch register 520.

The assertion evaluation logic 510 evaluates one or more assertions that assert a property that compares the memory address from which an instruction was fetched (e.g. the address of the program counter) to an allowable and/or unallowable memory address range associated with the current operating state of the instantiation of the hardware design to detect whether there has been an out-of-bounds violation. In this example, the assertion evaluation logic 510 evaluates one or more assertions that verify that when an instantiation of the hardware design 102 is operating in the boot operating mode that it only fetches instructions from BOOT ROM and when an instantiation of the hardware design 102 is operating in the normal operating mode that it only fetches instructions from RAM.

The following is example SVA code for implementing a set of assertions that determine whether the address of a fetched instruction falls within an allowable address range for the operating state the instantiation of the hardware design 102 was in when it fetched the instruction. In this example boot_complete_register is the boot complete register 516, instruction_fetch_register is the instruction fetch register 520, program_counter is the value of the current program counter which indicates the address from which the instruction was fetched, rom_base_addr is the base (or bottom) address of the BOOT ROM, rom_size_bytes is the size of the BOOT ROM in bytes, rom_address_top is the top address of the BOOT ROM, ram_size_bytes is the size of the RAM in bytes, and ram_address_top is the top address of the RAM, and the RAM addresses directly follow the BOOT ROM addresses.

```
wire [31:0] rom_address_top = rom_base_addr +
    rom_size_bytes;
wire [31:0] ram_address_top = rom_base_addr +
    rom_size_bytes + ram_size_bytes;
`define clk_rst @(posedge clk) disable iff (!resetn)
first_assertion:
assert property (`clk_rst !boot_complete_register &&
    instruction_fetch_register
    |-> program_counter < rom_address_top[29:0];
second_assertion:
assert property (`clk_rst boot_complete_register &&
    instruction_fetch_register
    |-> program_counter > rom_address_top[29:0];
third_assertion:
assert property (`clk_rst !boot_complete_register &&
    instruction_fetch_register;
    |-> program_counter < ram_address_top[29:0];
```

It will be evident to a person of skill in the art that the above SVA code for the first assertion states that if an instantiation of the hardware design 102 is in the boot operating state (!boot_complete_register) when it fetched an instruction from memory (instruction_fetch_register) then in the same clock cycle (|->) the address from which the instruction was fetched (program_counter) falls in the BOOT ROM address range (<rom_address_top). This first assertion is used to verify that when an instantiation of the hardware design 102 is operating in the boot operating state (e.g. executing a boot process) that it only fetches instructions from the BOOT ROM.

The above SVA code for the second assertion states that if an instantiation of the hardware design 102 is in the normal operating state (boot_complete_register) when it fetched an instruction from memory (instruction_fetch_register) then in the same clock cycle (|->) the address from which the instruction was fetched (program_counter) does not fall within the BOOT ROM address range (>rom_address_top).

The above SVA code for the third assertion states that if an instantiation of the hardware design 102 is in the normal operating state (boot_complete_register) when it fetched an instruction from memory (instruction_fetch_register) then in the same clock cycle (|->) the address from which the instruction was fetched (program_counter) falls within the RAM address range (<ram_address_top). The second and third assertions are used to verify that when an instantiation of the hardware design 102 is operating in the normal operating state (e.g. executing an application) that it only fetches instructions from the RAM (i.e. that it does not go back into the BOOT ROM).

As described above, when a formal verification tool 112 formally verifies an assertion it verifies that there is not a series of states of the instantiation of the hardware design 102 in which the assertion is not true. For example, for the first assertion described above, the formal verification tool 112 verifies that there is not a valid sequence of states of the instantiation of the hardware design 102 where an instantiation of the hardware design 102 will fetch an instruction from RAM when operating in the boot operating state. If there is at least one valid sequence of states in which an assertion is not true then the assertion will fail and the formal verification tool 112 outputs an indication that the assertion is not true (and, possibly, an indication of the sequence of states that caused the assertion to fail).

Accordingly, formal verification of the above set of assertions can be used to verify that the hardware design 102 does not have a bug or error that will cause it to fetch an instruction from a unallowable address—i.e. fetch an instruction from BOOT ROM when an instantiation of the hardware design 102 is operating in the normal operating state or fetch an instruction from RAM when an instantiation of the hardware design 102 is operating in the boot operating state.

Although, not shown in FIG. 5, it will be evident to a person of skill in the art that the logic blocks (e.g. boot complete detection logic 514, instruction fetch detection logic 518, and assertion evaluation logic 510) may be triggered by a clock. For example, one or more of the logic blocks may be triggered by the rising or positive edge of the clock. Furthermore, it will be evident to a person of skill in the art that one or more of the logic blocks (e.g. boot complete detection logic 514, instruction fetch detection logic 518, and assertion evaluation logic 510) may be combined or their functionality may divided between logic blocks in another manner.

Figure 6:
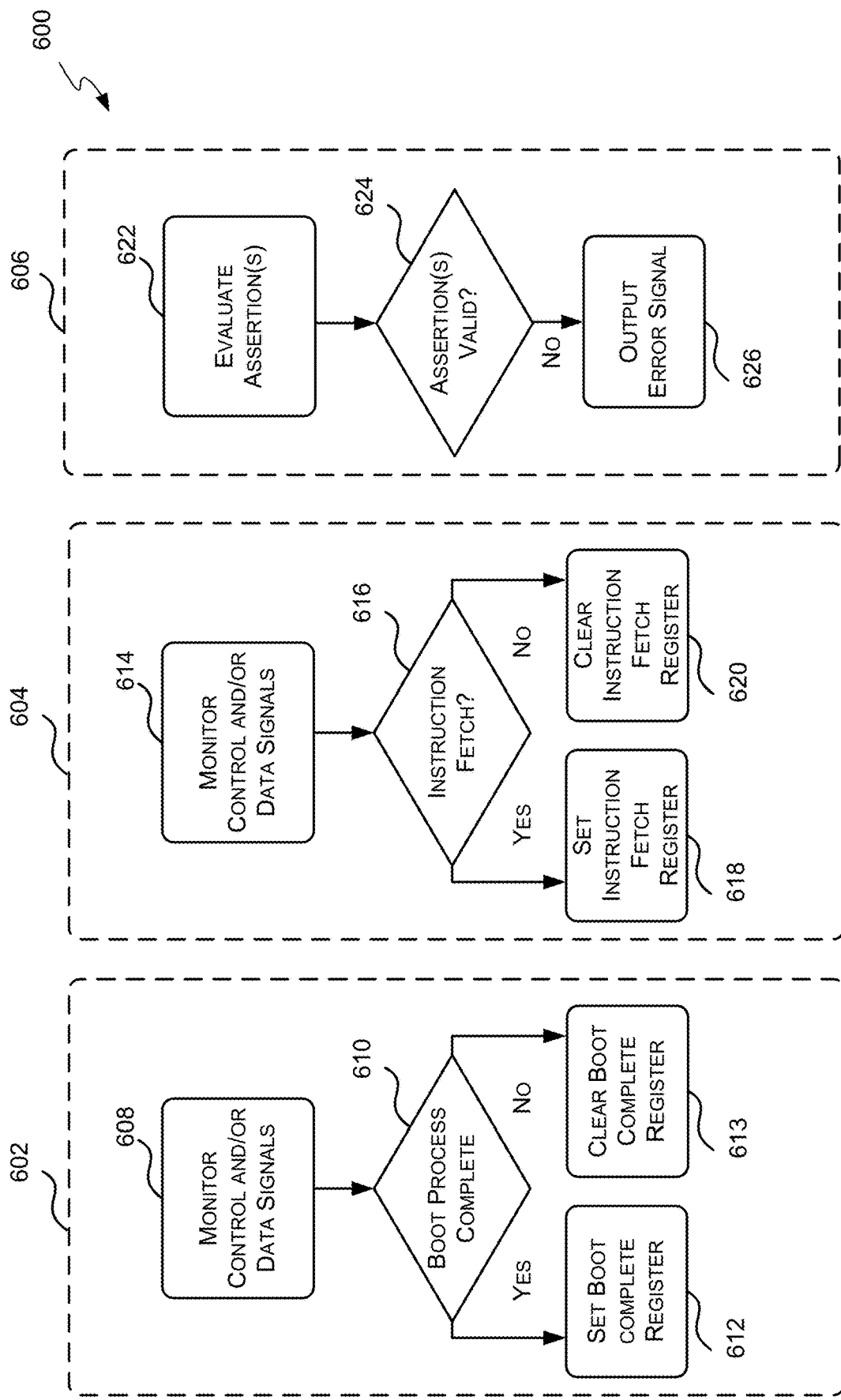
FIG. 6 is a flow diagram of an example method for detecting out-of-bounds violations in a hardware design for an electronic device using the hardware monitor of FIG. 5.

Reference is now made to FIG. 6 which illustrates an example method 600 for detecting out-of-bounds violations in a hardware design 102 which may be implemented by the hardware monitor 500 of FIG. 5. The method 600 detects an out-of-bounds violation by determining whether the hardware design 102 has completed the boot process or not, and detecting that an out-of-bounds violation has occurred if an instantiation of the hardware design 102 fetches an instruction from an address outside of BOOT ROM before the boot process is over, or if an instantiation of the hardware design 102 fetches an instruction from an address outside of RAM (e.g. fetches an instruction from BOOT ROM) after the boot process is over. The method 600 is divided into three sub-processes 602, 604 and 606 that are executed concurrently.

In the first sub-process 602, the boot complete detection logic 514 is triggered each clock cycle to monitor one or more control signals and/or data signals of the hardware design 102 (block 608), determine, based on the status of the monitored control and/or data signals, whether the boot process is complete (block 610), and set the boot complete register 516 if the boot process is complete (block 612) and clear the boot complete register 516 if the boot process is not complete (block 613). The specific control signals and/or data signals and the status thereof that indicate an instantiation of the hardware design 102 has completed the boot process depends on the configuration of the hardware design 102. For example, some hardware designs 102 may define a signal called power_on_complete which, when goes high, indicates that an instantiation of the hardware design has completed the boot process and is ready to execute user code.

In the second sub-process 604, the instruction fetch detection logic 518 is triggered each clock cycle to monitor one or more control signals and/or data signals of the hardware design 102 (block 614), determine, based on the control and/or data signals, whether the hardware design 102 fetched an instruction from memory (block 616), and if so, setting the instruction fetch register 520 (block 618), and if not, clearing the instruction fetch register 520 (block 620). The specific control signals and/or data signals and the status thereof that indicate an instantiation of the hardware design 102 has fetched an instruction from memory depends on the configuration of the hardware design 102.

In the third sub-process 606, the assertion evaluation logic 510 is triggered each clock cycle to evaluate the one or more assertions that compare the address from which an instruction was fetched (indicated by the program counter) to the ROM addresses or RAM addresses (depending on whether the boot processes has been completed) (block 622), and determine if all of the assertions hold, or are true (block 624). If one or more assertions are not true, then there has been an out-of-bounds violation, and an error message or signal is output (block 626).

In the method 600 of FIG. 6 processes 602, 604 and 606 are triggered each clock cycle. In some cases the processes 602, 604 and 606 may be triggered by the rising or positive edge of a clock or the falling or negative edge of a clock. In other examples the processes 602, 604 and 606 may be triggered by another event.

In some cases a hardware design 102 may be designed with a built-in detection and recovery circuit for detecting out-of-bounds and setting the state of the instantiation of the hardware design 102 to a known state when it detects an out-of-bounds violations. An example of such a circuit is described in the applicant's co-pending UK Patent Application filed the same day entitled OUT-OF-BOUNDS RECOVERY CIRCUIT. In these cases the hardware monitor 300, 500 may include additional logic (not shown) to detect an out-of-bounds violation and to set a register (e.g. an out of bounds register) (not shown) when an out-of-bounds violation is detected, and the assertion evaluation logic 310 or 510 may comprise one or more assertions to verify that if an out-of-bounds violation occurs that the instantiation of the hardware design 102 is transitioned to a predetermined safe state.

The following is example SVA code for implementing such an assertion. In this example out_of_bounds_register is a register that is set when an out-of-bounds violation is detected, current_state indicates the current state of the hardware design 102, and predetermined_safe_state is the predetermined safe state.

```
assert property (`clk_rst out_of_bounds_register
    |=> current_state == predetermined_safe_state;
```

It will be evident to a person of skill in the art that the above SVA code states that if an out of bounds violation has occurred (out_of_bounds_register) then in the next clock cycle (|=>) the instantiation of the hardware design 102 will be in a predetermined safe state (predetermined_safe_state).

Although the above examples describe using a hardware monitor 106, 300 and 500 to detect an out-of-bounds violation in a hardware design 102 by formally verifying the assertion(s) defined in the hardware monitor 106, 300 and 500 using a formal verification tool 112, in other examples the hardware monitor 106, 300 or 500 (including the assertion(s) defined therein) may be embodied (instantiated) in hardware (e.g. an integrated circuit) as part of, or in connection with, the hardware design 102. In these examples the assertion(s) of the hardware monitor 106, 300, or 500 act as a monitor during operation of the hardware. In particular, during operation of the hardware (e.g. electronic device) the hardware monitor 106, 300, or 500 repeatedly evaluates the assertion(s) (e.g. upon the positive edge of the clock signal).

If the hardware monitor 106, 300, or 500 detects that an assertion has failed or is not true then the hardware monitor 106, 300 or 500 may generate a signal indicating an out-of bounds violation has occurred. This can improve observability by being able to identify an out-of-bounds violation as soon as it is triggered. Without such assertion(s) out-of-bounds violations can only be identified in simulation-based verification or during operation if it propagates to an observable output and then it is only evident at the end of the simulation. By using one or more assertions, out-of-bounds violations can be checked and observed instantly, at its source.

Figure 7:
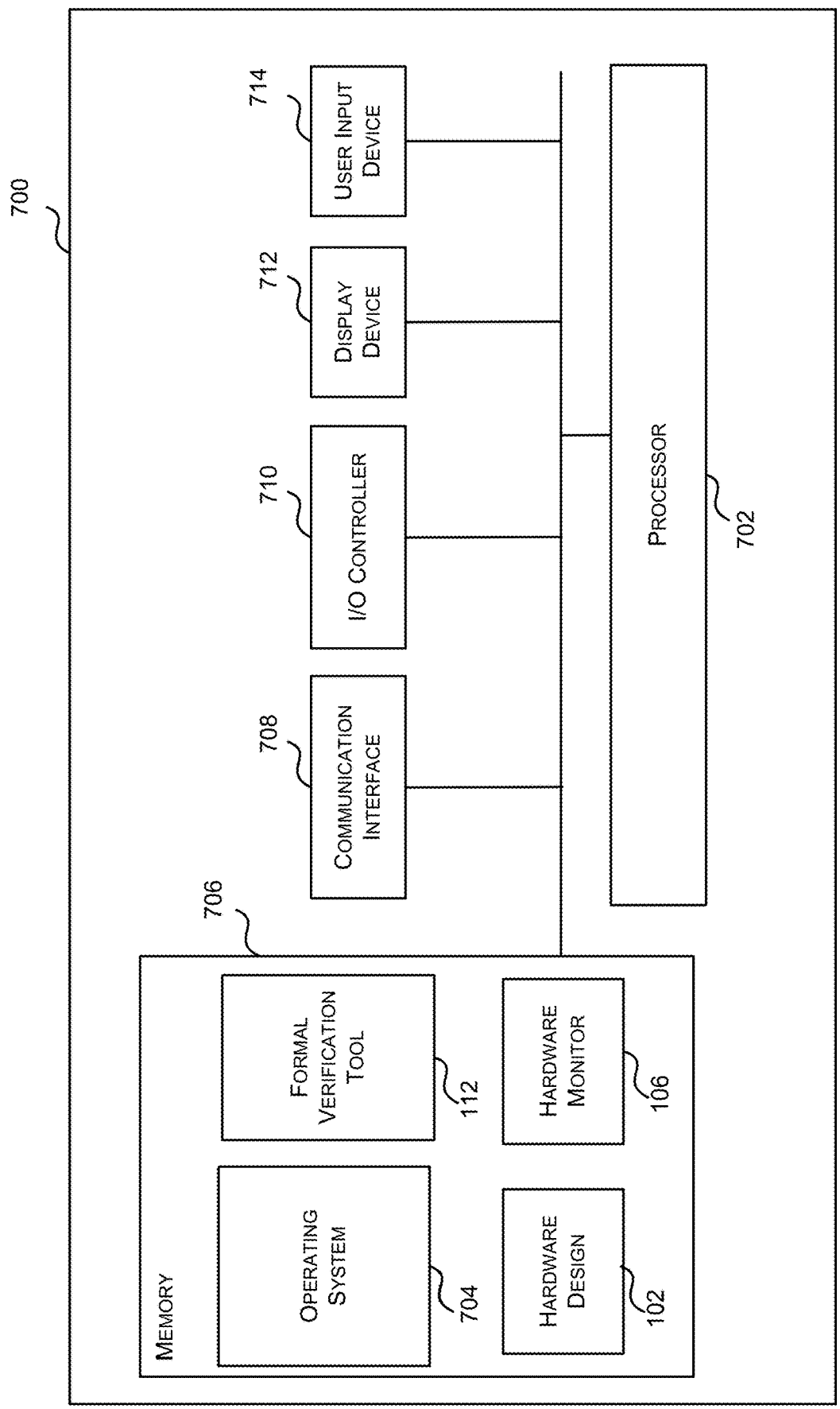
FIG. 7 is a block diagram of an example general purpose computing-based device.

FIG. 7 illustrates various components of an exemplary general purpose computing-based device 700 which may be implemented as any form of a computing and/or electronic device, and in which embodiments of the systems, methods and hardware monitors described above may be implemented.

General purpose computing-based device 700 comprises one or more processors 702 which may be microprocessors, controllers or any other suitable type of processors for processing computer executable instructions to control the operation of the device in order to determine if there is a bug or error in a hardware design 102 that will cause an out-of-bounds violation. In some examples, for example where a system on a chip architecture is used, the processors 702 may include one or more fixed function blocks (also referred to as accelerators) which implement a part of the method of detecting out-of-bounds violations a hardware design 102 in hardware (rather than software or firmware). Platform software comprising an operating system 704 or any other suitable platform software may be provided at the computing-based device to enable application software, such as a formal verification tool 112, to be executed on the device.

The computer executable instructions may be provided using any computer-readable media that is accessible by general purpose computing-based device 700. Computer-readable media may include, for example, computer storage media such as memory 706 and communications media. Computer storage media (i.e. non-transitory machine readable media), such as memory 706, includes volatile and non-volatile, removable and non-removable media implemented in any method or technology for storage of information such as computer readable instructions, data structures, program modules or other data. Computer storage media includes, but is not limited to, RAM, ROM, EPROM, EEPROM, flash memory or other memory technology, CD-ROM, digital versatile disks (DVD) or other optical storage, magnetic cassettes, magnetic tape, magnetic disk storage or other magnetic storage devices, or any other non-transmission medium that can be used to store information for access by a computing device. In contrast, communication media may embody computer readable instructions, data structures, program modules, or other data in a modulated data signal, such as a carrier wave, or other transport mechanism. As defined herein, computer storage media does not include communication media. Although the computer storage media (i.e. non-transitory machine readable media, e.g. memory 706) is shown within the general purpose computing-based device 700 it will be appreciated that the storage may be distributed or located remotely and accessed via a network or other communication link (e.g. using communication interface 708).

The general purpose computing-based device 700 also comprises an input/output controller 710 arranged to output display information to a display device 712 which may be separate from or integral to the general purpose computing-based device 700. The display information may provide a graphical user interface. The input/output controller 710 is also arranged to receive and process input from one or more devices, such as a user input device 714 (e.g. a mouse or a keyboard). This user input may be used to, for example, initiate formal verification of the assertions defined in the hardware monitor 106. In an embodiment the display device 712 may also act as the user input device 714 if it is a touch sensitive display device. The input/output controller 710 may also output data to devices other than the display device, e.g. a locally connected printing device (not shown in FIG. 7).

The hardware monitors of FIGS. 1, 3, and 5 are shown as comprising a number of functional blocks. This is schematic only and is not intended to define a strict division between different logic elements of such entities. Each functional block may be provided in any suitable manner. It is to be understood that intermediate values described herein as being formed by a hardware monitor need not be physically generated by the hardware monitor at any point and may merely represent logical values which conveniently describe the processing performed by the hardware monitor between its input and output.

The terms computer program code and computer readable instructions as used herein refer to any kind of executable code for processors, including code expressed in a machine language, an interpreted language or a scripting language. Executable code includes binary code, machine code, byte-code, code defining an integrated circuit (such as a hardware description language or netlist), and code expressed in a programming language code such as C, Java or OpenCL. Executable code may be, for example, any kind of software, firmware, script, module or library which, when suitably executed, processed, interpreted, compiled, executed at a virtual machine or other software environment, cause a processor of the computer system at which the executable code is supported to perform the tasks specified by the code.

As described above a hardware design, which also may be referred to herein as an integrated circuit definition data set, describes the structure and functionality of an integrated circuit. The hardware design may be implemented in software, such as HDL (hardware description language). Accordingly, there may be provided a computer readable storage medium having encoded thereon computer readable program code in the form of an integrated circuit definition dataset (e.g. hardware design) that when processed in an integrated circuit manufacturing system configures the system to manufacture an integrated circuit forming an electronic device according to the hardware design.

An integrated circuit definition dataset may be in the form of computer code, for example as a netlist, code for configuring a programmable chip, as a hardware description language defining an integrated circuit at any level, including as register transfer level (RTL) code, as high-level circuit representations such as Verilog or VHDL, and as low-level circuit representations such as OASIS (RTM) and GDSII. Higher level representations which logically define an integrated circuit (such as RTL) may be processed at a computer system configured for generating a manufacturing definition of an integrated circuit in the context of a software environment comprising definitions of circuit elements and rules for combining those elements in order to generate the manufacturing definition of an integrated circuit so defined by the representation. As is typically the case with software executing at a computer system so as to define a machine, one or more intermediate user steps (e.g. providing commands, variables etc.) may be required in order for a computer system configured for generating a manufacturing definition of an integrated circuit to execute code defining an integrated circuit so as to generate the manufacturing definition of that integrated circuit.

An example of processing an integrated circuit definition dataset at an integrated circuit manufacturing system so as to configure the system to manufacture an electronic device will now be described with respect to FIG. 8.

Figure 8:
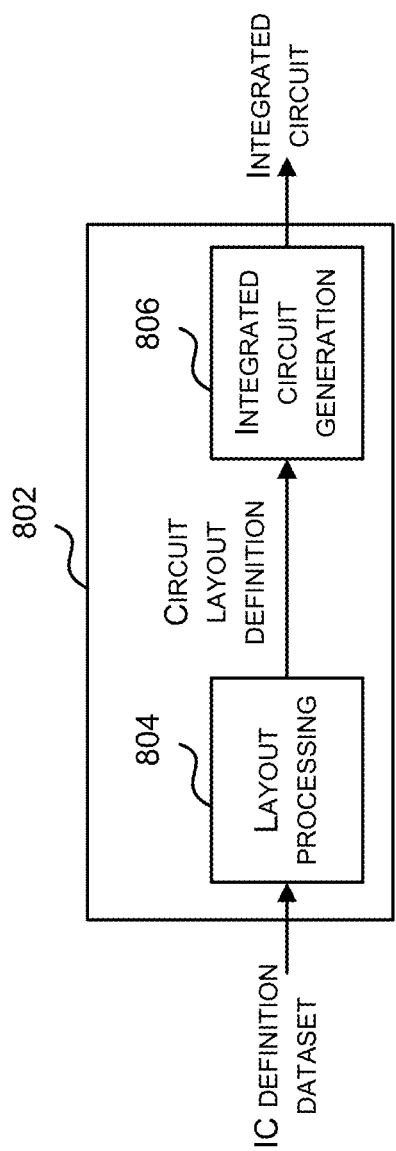
FIG. 8 is a block diagram of an example integrated circuit manufacturing system.

FIG. 8 shows an example of an integrated circuit (IC) manufacturing system 802 which comprises a layout processing system 804 and an integrated circuit generation system 806. The IC manufacturing system 802 is configured to receive an IC definition dataset (e.g. a hardware design 102), process the IC definition dataset, and generate an IC according to the IC definition dataset (e.g. hardware design 102). The processing of the hardware designs 102 described herein configures the IC manufacturing system 802 to manufacture an integrated circuit forming an electronic device.

The layout processing system 804 is configured to receive and process the IC definition dataset (e.g. hardware design 102) to determine a circuit layout. Methods of determining a circuit layout from an IC definition dataset are known in the art, and for example may involve synthesising RTL code to determine a gate level representation of a circuit to be generated, e.g. in terms of logical components (e.g. NAND, NOR, AND, OR, MUX and FLIP-FLOP components). A circuit layout can be determined from the gate level representation of the circuit by determining positional information for the logical components. This may be done automatically or with user involvement in order to optimise the circuit layout. When the layout processing system 804 has determined the circuit layout it may output a circuit layout definition to the IC generation system 806. A circuit layout definition may be, for example, a circuit layout description.

The IC generation system 806 generates an IC according to the circuit layout definition, as is known in the art. For example, the IC generation system 806 may implement a semiconductor device fabrication process to generate the IC, which may involve a multiple-step sequence of photo lithographic and chemical processing steps during which electronic circuits are gradually created on a wafer made of semiconducting material. The circuit layout definition may be in the form of a mask which can be used in a lithographic process for generating an IC according to the circuit definition. Alternatively, the circuit layout definition provided to the IC generation system 806 may be in the form of computer-readable code which the IC generation system 806 can use to form a suitable mask for use in generating an IC.

The different processes performed by the IC manufacturing system 802 may be implemented all in one location, e.g. by one party. Alternatively, the IC manufacturing system 802 may be a distributed system such that some of the processes may be performed at different locations, and may be performed by different parties. For example, some of the stages of: (i) synthesising RTL code representing the IC definition dataset to form a gate level representation of a circuit to be generated, (ii) generating a circuit layout based on the gate level representation, (iii) forming a mask in accordance with the circuit layout, and (iv) fabricating an integrated circuit using the mask, may be performed in different locations and/or by different parties.

In other examples, processing of the integrated circuit definition dataset at an integrated circuit manufacturing system may configure the system to manufacture an integrated circuit without the IC definition dataset being processed so as to determine a circuit layout. For instance, an integrated circuit definition dataset may define the configuration of a reconfigurable processor, such as an FPGA, and the processing of that dataset may configure an IC manufacturing system to generate a reconfigurable processor having that defined configuration (e.g. by loading configuration data to the FPGA).

In some examples, an integrated circuit definition dataset could include software which runs on hardware defined at the dataset or in combination with hardware defined at the dataset. In the example shown in FIG. 8, the IC generation system may further be configured by an integrated circuit definition dataset to, on manufacturing an integrated circuit, load firmware onto that integrated circuit in accordance with program code defined at the integrated circuit definition dataset or otherwise provide program code with the integrated circuit for use with the integrated circuit.

Those skilled in the art will realize that storage devices utilized to store program instructions can be distributed across a network. For example, a remote computer may store an example of the process described as software. A local or terminal computer may access the remote computer and download a part or all of the software to run the program. Alternatively, the local computer may download pieces of the software as needed, or execute some software instructions at the local terminal and some at the remote computer (or computer network). Those skilled in the art will also realize that by utilizing conventional techniques known to those skilled in the art that all, or a portion of the software instructions may be carried out by a dedicated circuit, such as a DSP, programmable logic array, or the like.

The methods described herein may be performed by a computer configured with software in machine readable form stored on a tangible storage medium e.g. in the form of a computer program comprising computer readable program code for configuring a computer to perform the constituent portions of described methods or in the form of a computer program comprising computer program code means adapted to perform all the steps of any of the methods described herein when the program is run on a computer and where the computer program may be embodied on a computer readable storage medium. Examples of tangible (or non-transitory) storage media include disks, thumb drives, memory cards etc. and do not include propagated signals. The software can be suitable for execution on a parallel processor or a serial processor such that the method steps may be carried out in any suitable order, or simultaneously.

The hardware components described herein may be generated by a non-transitory computer readable storage medium having encoded thereon computer readable program code.

Memories storing machine executable data for use in implementing disclosed aspects can be non-transitory media. Non-transitory media can be volatile or non-volatile. Examples of volatile non-transitory media include semiconductor-based memory, such as SRAM or DRAM. Examples of technologies that can be used to implement non-volatile memory include optical and magnetic memory technologies, flash memory, phase change memory, resistive RAM.

A particular reference to "logic" refers to structure that performs a function or functions. An example of logic includes circuitry that is arranged to perform those function(s). For example, such circuitry may include transistors and/or other hardware elements available in a manufacturing process. Such transistors and/or other elements may be used to form circuitry or structures that implement and/or contain memory, such as registers, flip flops, or latches, logical operators, such as Boolean operations, mathematical operators, such as adders, multipliers, or shifters, and interconnect, by way of example. Such elements may be provided as custom circuits or standard cell libraries, macros, or at other levels of abstraction. Such elements may be interconnected in a specific arrangement. Logic may include circuitry that is fixed function and circuitry can be programmed to perform a function or functions; such programming may be provided from a firmware or software update or control mechanism. Logic identified to perform one function may also include logic that implements a constituent function or sub-process. In an example, hardware logic has circuitry that implements a fixed function operation, or operations, state machine or process.

Any range or device value given herein may be extended or altered without losing the effect sought, as will be apparent to the skilled person.

It will be understood that the benefits and advantages described above may relate to one embodiment or may relate to several embodiments. The embodiments are not limited to those that solve any or all of the stated problems or those that have any or all of the stated benefits and advantages.

Any reference to 'an' item refers to one or more of those items. The term 'comprising' is used herein to mean including the method blocks or elements identified, but that such blocks or elements do not comprise an exclusive list and an apparatus may contain additional blocks or elements and a method may contain additional operations or elements. Furthermore, the blocks, elements and operations are themselves not impliedly closed.

The steps of the methods described herein may be carried out in any suitable order, or simultaneously where appropriate. The arrows between boxes in the figures show one example sequence of method steps but are not intended to exclude other sequences or the performance of multiple steps in parallel. Additionally, individual blocks may be deleted from any of the methods without departing from the spirit and scope of the subject matter described herein. Aspects of any of the examples described above may be combined with aspects of any of the other examples described to form further examples without losing the effect sought. Where elements of the figures are shown connected by arrows, it will be appreciated that these arrows show just one example flow of communications (including data and control messages) between elements. The flow between elements may be in either direction or in both directions.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein. In view of the foregoing description it will be evident to a person skilled in the art that various modifications may be made within the scope of the invention.

The invention claimed is:

1. A method of verifying that a hardware design for an electronic device does not comprise a bug or error that will cause an instantiation of the hardware design to fetch an instruction from an out-of-bounds address, the method comprising:
   receiving the hardware design and a hardware monitor comprising:
      monitor and detection logic configured to repeatedly determine a current operating state of an instantiation of the hardware design and detect when the instantiation of the hardware design implements a fetch of an instruction from memory; and
      assertion evaluation logic configured to evaluate one or more assertions that assert a formal property that compares a memory address from which the instruction was fetched to an allowable memory address range or an unallowable memory address range associated with the current operating state of the instantiation of the hardware design to determine whether an out-of-bounds violation has occurred in the hardware design;

formally verifying, using a formal verification tool, the one or more assertions are true for the hardware design; and outputting one or more signals indicating whether or not each of the one or more assertions was successfully verified to identify whether the hardware design has a bug or error that causes an out-of-bounds violation.

2. The method of claim 1, wherein the monitor and detection logic comprises one or more operating state registers and operating state detection logic configured to detect the current operating state of the instantiation of the hardware design and to set the one or more operating state registers to reflect the current operating state.

3. The method of claim 2, wherein the operating state detection logic is configured to detect whether the instantiation of the hardware design has completed a boot process, and in response to determining that the instantiation of the hardware design has completed the boot process, set an operating state register.

4. The method of claim 1, wherein the monitor and detection logic comprises an instruction fetch register and instruction fetch detection logic configured to detect when the instantiation of the hardware design implements a fetch of an instruction from memory, and in response to detecting that the instantiation of the hardware design implements a fetch of an instruction from memory, set the instruction fetch register.

5. The method of claim 1, wherein the memory address from which the instruction was fetched is determined from a program counter of the hardware design.

6. The method of claim 1, wherein an out-of-bounds violation occurs when the instantiation of the hardware design accesses a memory address outside of an allowable memory address range associated with the current operating state of the instantiation of the hardware design.

7. The method of claim 1, wherein the assertion evaluation logic is configured to, in response to determining that at least one of the one or more assertions is evaluated to be false, output a signal indicating an out-of-bounds violation has occurred in the hardware design.

8. The method of claim 1, wherein when the hardware design is processed in an integrated circuit manufacturing system, the hardware design configures the integrated circuit manufacturing system to manufacture the electronic device.

9. The method of claim 1, wherein the hardware monitor is embodied in an integrated circuit definition dataset, which when processed in an integrated circuit manufacturing system, configures the integrated circuit manufacturing system to manufacture the hardware monitor.

10. The method of claim 1, further comprising, in response to at least one of the one or more assertions not being successfully verified, outputting, an indication of a sequence of states of the hardware design in which the assertion is not true.

11. The method of claim 1, further comprising, in response to at least one of the one or more assertions not being successfully verified, modifying the hardware design.

12. The method of claim 1, further comprising, in response to each of the one or more assertions being successfully verified, generating a hardware manifestation of the electronic device based on the hardware design.

13. A non-transitory computer readable storage medium having stored thereon computer readable instructions that, when executed at a computer system, cause the computer system to perform the method as set forth in claim 1.

14. A system configured to verify that a hardware design for an electronic device does not comprise an error or bug that will cause an instantiation of the hardware design to fetch an instruction from an out-of-bounds address, the system comprising:

a memory configured to store:

the hardware design;

a formal verification tool; and a hardware monitor comprising:

monitor and detection logic configured to repeatedly determine a current operating state of an instantiation of the hardware design and detect when the instantiation of the hardware design implements a fetch of an instruction from memory; and assertion evaluation logic configured to evaluate one or more assertions that assert a formal property that compares a memory address from which the instruction was fetched to an allowable memory address range or an unallowable memory address range associated with the current operating state of the instantiation of the hardware design to determine whether an out-of-bounds violation has occurred in the hardware design;

one or more processors configured to:

formally verify, using the formal verification tool, that the one or more assertions are true for the hardware design; and output one or more signals indicating whether or not each of the one or more assertions was successfully verified to identify whether the hardware design has a bug or error that causes an out-of-bounds violation.

15. The system of claim 14, wherein the one or more processors are further configured to, in response to at least one of the one or more assertions not being successfully verified, output an indication of a sequence of states of the hardware design for which the assertion is not true.

16. The system of claim 14, further comprising an integrated circuit manufacturing system configured to process the hardware design so as to manufacture the electronic device.

17. The system of claim 16, wherein the integrated circuit manufacturing system comprises:

a non-transitory computer readable storage medium having stored thereon the hardware design;

a layout processing system configured to process the hardware design so as to generate a circuit layout description of the electronic device; and an integrated circuit generation system configured to manufacture the electronic device according to the circuit layout description.

* * * * *